US011677152B2

(12) United States Patent
Gupta et al.

(10) Patent No.: US 11,677,152 B2
(45) Date of Patent: Jun. 13, 2023

(54) PACKAGED ELECTRONIC DEVICE WITH INTEGRAL ANTENNA

(71) Applicant: Texas Instruments Incorporated, Dallas, TX (US)

(72) Inventors: Vikas Gupta, Dallas, TX (US); Sadia Naseem, Dallas, TX (US); Meysam Moallem, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 129 days.

(21) Appl. No.: 17/190,521

(22) Filed: Mar. 3, 2021

(65) Prior Publication Data

US 2022/0285844 A1  Sep. 8, 2022

(51) Int. Cl.
*H01Q 9/04* (2006.01)
*H01L 23/498* (2006.01)
*H01L 23/00* (2006.01)
*H01L 23/66* (2006.01)

(52) U.S. Cl.
CPC ..... *H01Q 9/0407* (2013.01); *H01L 23/49822* (2013.01); *H01L 23/66* (2013.01); *H01L 24/81* (2013.01); *H01L 2223/6677* (2013.01); *H01L 2224/81815* (2013.01)

(58) Field of Classification Search
CPC . H01Q 9/0407; H01L 23/49822; H01L 23/66; H01L 24/81; H01L 2223/6677; H01L 2224/81815
See application file for complete search history.

(56) References Cited

U.S. PATENT DOCUMENTS

| | | | |
|---|---|---|---|
| 2007/0029667 A1* | 2/2007 | Fujii | H01Q 23/00 257/E23.079 |
| 2020/0118949 A1* | 4/2020 | Moallem | H01L 25/16 |
| 2020/0194871 A1 | 6/2020 | Moallem et al. | |
| 2020/0212536 A1 | 7/2020 | Gupta et al. | |
| 2020/0259239 A1 | 8/2020 | Moallem et al. | |
| 2020/0259240 A1 | 8/2020 | Moallem | |
| 2020/0403299 A1 | 12/2020 | Gupta et al. | |
| 2021/0050652 A1 | 2/2021 | Moallem et al. | |

OTHER PUBLICATIONS

A. E. I. Lamminen, et al. "60-GHz Patch Antennas and Arrays on LTCC With Embedded-Cavity Substrates", IEEE Trans. Ant. & Prop., vol. 56, No. 9, 2008.

* cited by examiner

*Primary Examiner* — Seung H Lee
(74) *Attorney, Agent, or Firm* — Ronald O. Neerings; Frank D. Cimino

(57) ABSTRACT

An antenna apparatus in a packaged electronic device includes: an antenna assembly with a conductive antenna, and an insulator; a conductive feed line extending on or in a substrate; a conductive layer with an aperture on or in the substrate between the conductive feed line and an exposed portion of the conductive antenna; and a support structure mounted to a portion of the substrate and to a portion of the antenna assembly to support the antenna assembly and to provide an air gap between the exposed portion of the conductive antenna and the aperture.

20 Claims, 11 Drawing Sheets

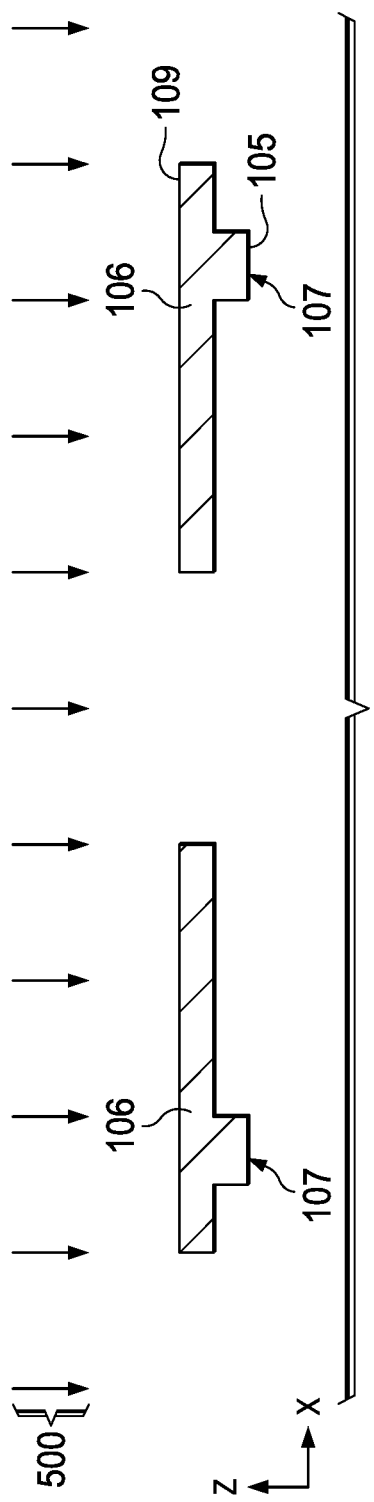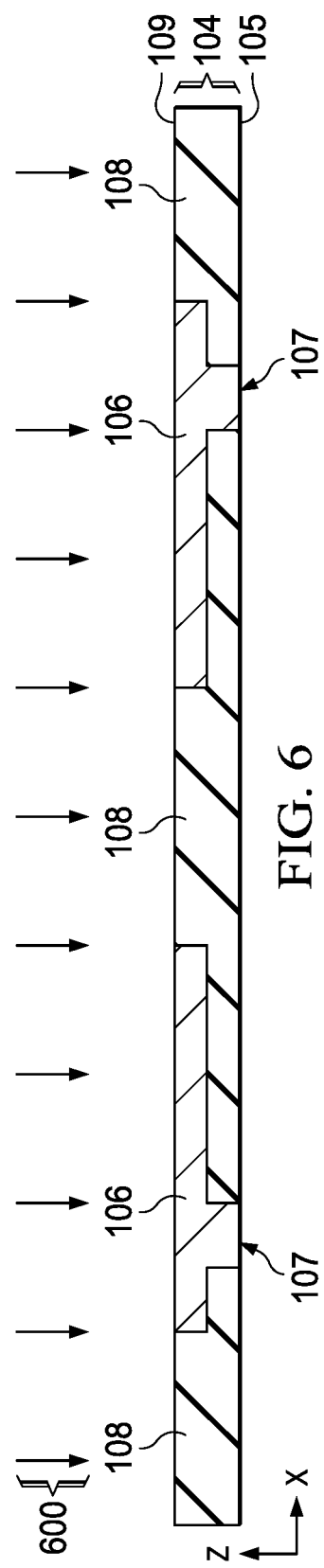

PACKAGED ELECTRONIC DEVICE WITH INTEGRAL ANTENNA

BACKGROUND

Wireless systems are becoming more compact as communications capabilities are being integrated into many devices and components in industrial automation, automotive and other system applications. Reducing the size of communication circuits can include integrating antennas in packaged electronic devices, such as transmitters and receivers. At the package interface with the antenna, a low dielectric constant material is desirable to enhance antenna performance including efficiency. Many device packages are manufactured with organic substrate material layers or ceramic substrates for low cost, but these materials have limited dielectric properties that inhibit the performance of an integrated antenna, such as an antenna formed in a multi-layer substrate. Using different materials with lower dielectric constants increases manufacturing costs, and a need remains for improved integrated antenna performance in low cost packaging structures.

SUMMARY

In accordance with one aspect, an electronic device is provided that comprises a substrate, a semiconductor die attached to a first side of the substrate, and antenna assembly, and a support structure. In one implementation, the substrate includes a conductive feed line, a conductive layer with an aperture between the feed line and the first side of the substrate, as well as a conductive terminal attached to a second side of the substrate, for example, to facilitate soldering to a host printed circuit board (PCB). The antenna assembly in one example is positioned with a conductive antenna patch structure is spaced apart from and faces the aperture of the substrate to provide a low dielectric air gap for improved antenna efficiency and performance.

In one example, the conductive layer of the substrate is spaced apart from the conductive feed line along a first direction, and the aperture is aligned with a portion of the conductive feed line. In one implementation, the conductive layer extends along the first side of the substrate. In another implementation, the conductive layer is an internal layer of the substrate positioned between the conductive feed line and the first side of the substrate.

The semiconductor die is spaced apart from the aperture along an orthogonal second direction in one example to provide an unobstructed air gap between the antenna assembly and the aperture of the substrate. In one implementation, the semiconductor die has a first terminal coupled to the conductive feed line, and a second terminal coupled to the conductive layer, for example, for signal and ground connections.

The antenna assembly includes opposite first and second sides, a conductive antenna, and an insulator. The first side of the antenna assembly is spaced apart from and faces the first side of the substrate along the first direction. The conductive antenna includes a first portion, such as a base, that is exposed along the second side of the antenna assembly, and a second portion, such as a patch feature, that is exposed along the first side of the antenna assembly. The second portion is spaced apart from and at least partially faces the aperture along the first direction. In certain implementations, the antenna assembly is a molded lead frame structure with aluminum or copper base and patch features, in which the insulator includes a molding compound. In other implementations, the insulator includes a ceramic material. In further implementations, the insulator includes a laminate.

The support structure is mounted to a portion of the first side of the substrate and to a portion of the first side of the antenna assembly, and supports the first side of the antenna assembly in a position that is spaced apart from the first side of the substrate along the first direction. In certain implementations, the support structure includes solder, for example, ball grid array (BGA) type solder balls. In another implementation, the support structure includes epoxy.

In accordance with another aspect, an antenna apparatus includes an antenna assembly having a first side, an opposite second side, a conductive antenna, and an insulator engaging the conductive antenna. The conductive antenna in one example includes a first portion with an exposed surface along the second side, and a second portion exposed along the first side. The antenna apparatus also includes a conductive feed line that extends on or in a substrate, and a conductive layer on or in the substrate. The conductive layer includes an aperture between the conductive feed line and the second portion of the conductive antenna. The antenna apparatus also includes a support structure mounted to a portion of the substrate and to a portion of the first side of the antenna assembly to support the antenna assembly and to provide an air gap between the second portion of the conductive antenna and the aperture.

In one example, the insulator includes a molding compound. In other example, the insulator is or includes a ceramic material. In further implementations, the insulator includes a laminate. In this or another example, the support structure includes solder. In other implementations, the support structure includes epoxy. In these or other implementations, the conductive antenna includes copper. In certain examples, the conductive layer extends along a side of the substrate. In another implementation, the conductive layer is an internal layer of the substrate positioned between the conductive feed line and the antenna assembly.

In accordance with a further aspect, a method includes attaching a semiconductor die to a substrate, electrically coupling terminals of the semiconductor die to conductive pads of the substrate, and attaching an antenna assembly to the substrate using a support structure to provide an air gap between an exposed portion of a conductive antenna of the antenna assembly and an aperture in a conductive layer on or in the substrate.

In certain examples, the method also includes forming a conductive antenna having a first portion, and a second portion, and engaging the conductive antenna to an insulator to form the antenna assembly having a first side and an opposite second side, with a surface of the first portion exposed along the second side, and a surface of the second portion exposed along the first side. In one implementation, attaching the antenna assembly to the substrate includes positioning the antenna assembly with the surface of the second portion spaced apart from and facing the aperture in the conductive layer on or in the substrate.

In this or another implementation, engaging the conductive antenna to the insulator includes performing a molding process that engages a molding compound with portions of the conductive antenna, and that leaves the surface of the first portion exposed along the second side, and the surface of the second portion exposed along the first side. In these or other implementations, attaching the semiconductor die to the substrate includes performing a flip-chip attach process that engages conductive features of the semiconductor die to the conductive pads of the substrate, and electrically coupling terminals of the semiconductor die the conductive pads of the substrate includes performing a reflow process that solders the conductive features of the semiconductor die to the conductive pads of the substrate.

In another implementation, electrically coupling terminals of the semiconductor die the conductive pads of the substrate includes performing a wire bonding process that couples bond wires between the conductive features of the semiconductor die and respective conductive pads of the substrate, and the method includes attaching conductive solder balls to conductive features of the substrate.

BRIEF DESCRIPTION OF THE DRAWINGS

FIGS. 5-12 are partial sectional side elevation views of the electronic device of FIGS. 1-3 undergoing fabrication processing according to the method of FIG. 4.

DETAILED DESCRIPTION

Figure 1:
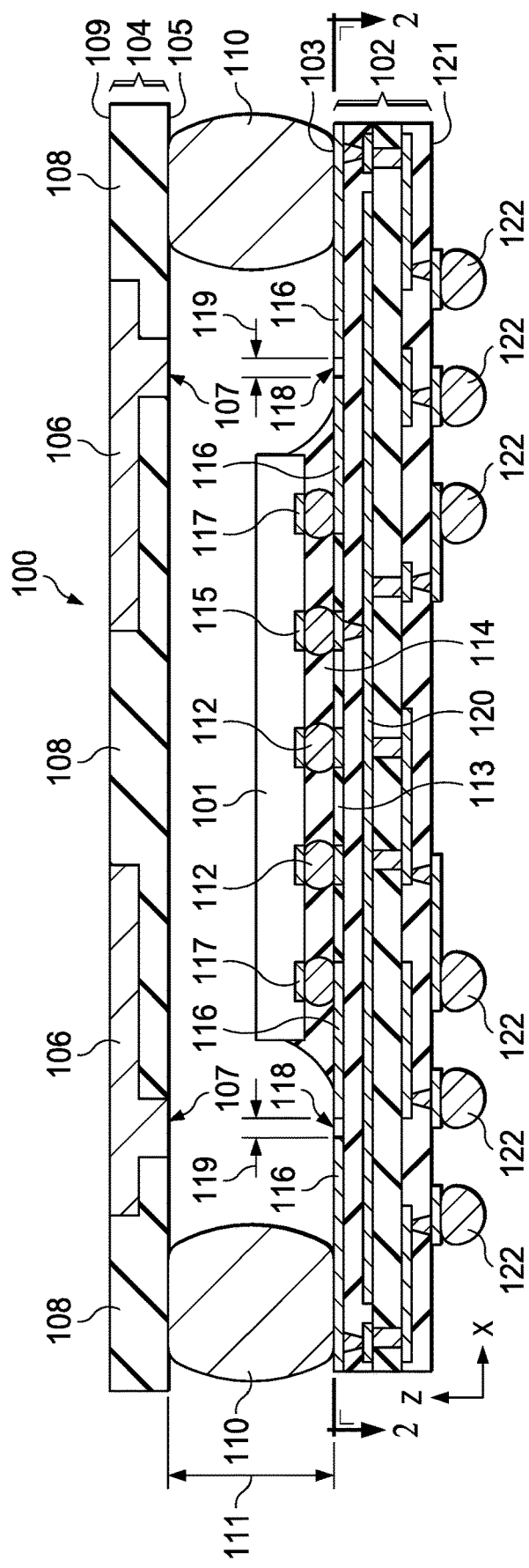
FIG. 1 is a sectional side elevation view of an electronic device with an integral antenna according to one aspect.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 2:
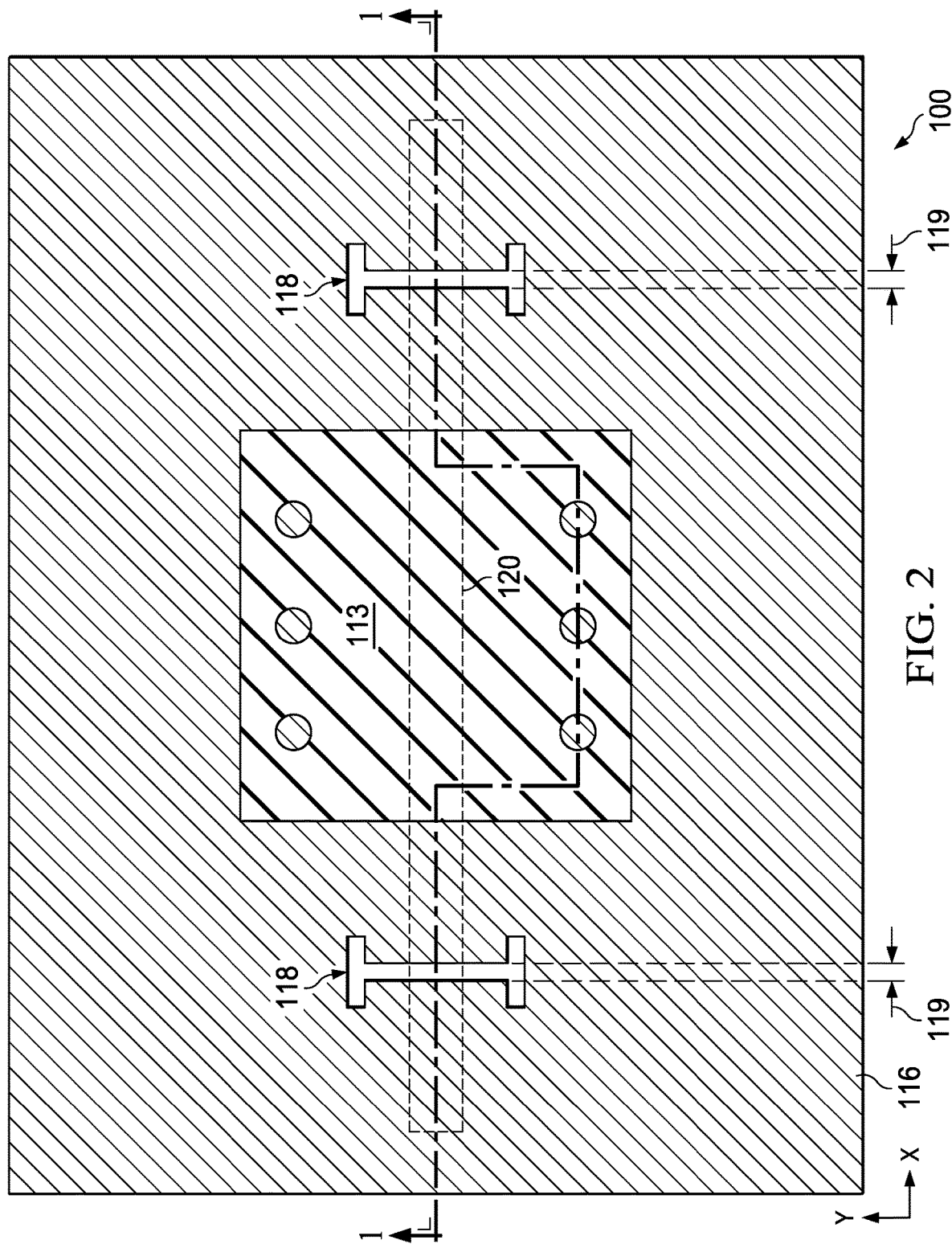
FIG. 2 is a sectional top plan view of the electronic device taken along line 2-2 in FIG. 1.
Figure 3:
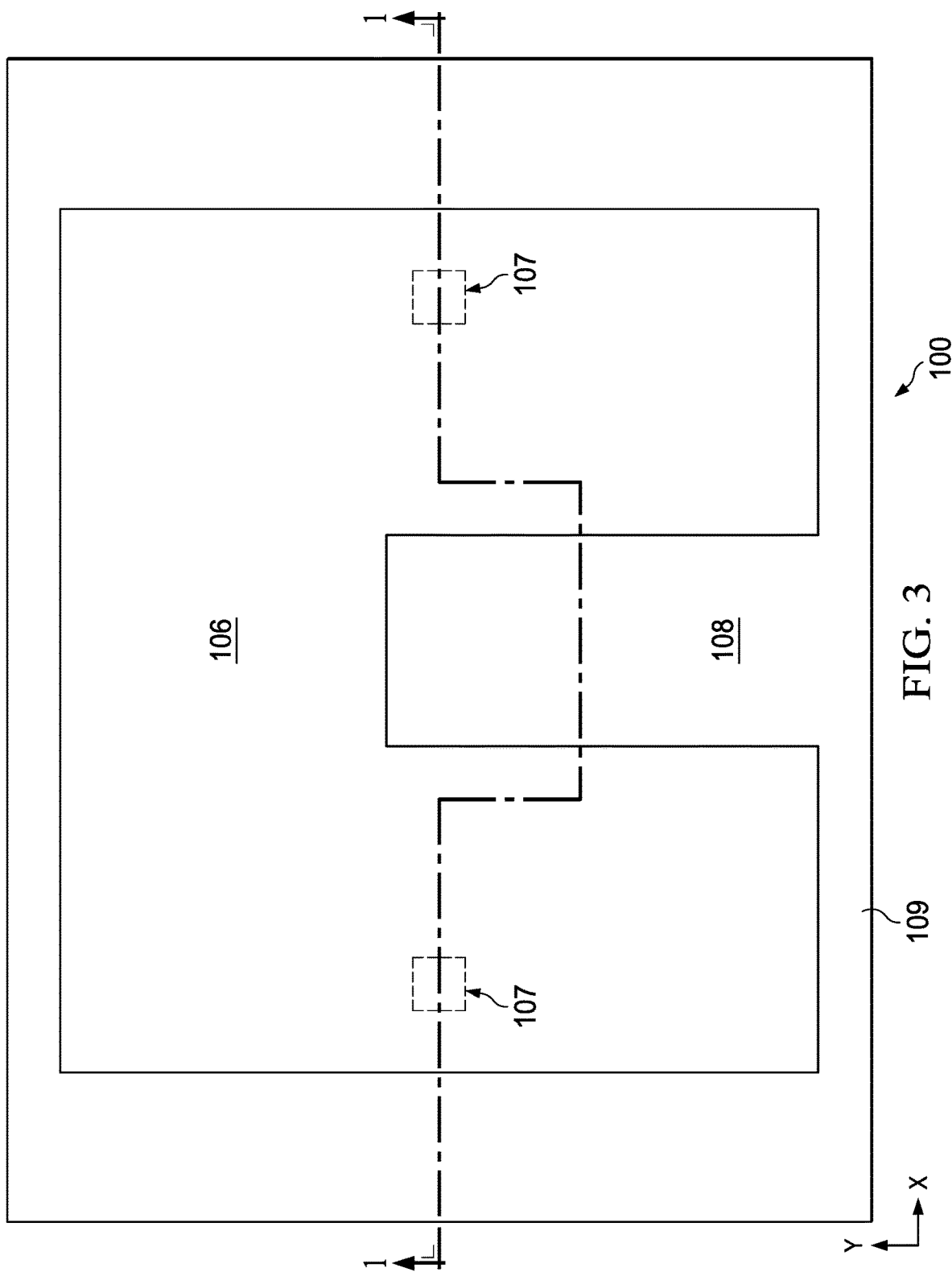
FIG. 3 is a top plan view of the electronic device of FIGS. 1 and 2.

Referring initially to FIGS. 1-3, FIG. 1 shows a sectional side elevation view of a packaged electronic device 100 (e.g., semiconductor device) with an integral antenna according to one aspect of the present disclosure. FIG. 2 shows a sectional top plan view of the electronic device 100 taken along line 2-2 in FIG. 1, and the sectional view of FIG. 1 is taken along line 1-1 in FIGS. 2 and 3. FIG. 3 shows a top plan view of the electronic device 100. The substrate 102 is a planar multilayer structure like a printed circuit board, with patterned conductive features formed on or within laminated organic layers, with conductive vias interconnecting certain features of different layers. In other implementations a single layer substrate is used, including conductive features on top and bottom sides thereof and vias interconnecting the top and bottom sides.

The electronic device 100 includes a semiconductor die 101 and a substrate 102 having a first side 103. The semiconductor die 101 is attached to the first side 103 of the substrate 102 (e.g., the upper or top side in the illustrated orientation) by flip-chip die attach processing as described further below. Different die attachment techniques and materials are used in other embodiments (e.g., FIGS. 13 and 14 below).

The electronic device 100 includes an antenna assembly 104, such as a molded lead frame structure in one example. The antenna assembly 104 includes a first side 105, for example, a lower or bottom side in the illustrated orientation. The first side 105 of the antenna assembly 104 is generally parallel to and faces the first side 103 of the substrate 102. The antenna assembly 104 includes a conductive antenna 106, 107 and an insulator 108. In one example, the conductive antenna 106, 107 is or includes aluminum. In another example, the conductive antenna 106, 107 is or includes copper. In one example, the insulator 108 includes a ceramic material. In another example, the insulator 108 includes a laminate. In the illustrated example, the insulator 108 includes a molding compound. The antenna assembly 104 includes a planar second side (e.g., an upper or top side in the illustrated orientation). The first side 105 of the antenna assembly 104 is spaced apart from and faces the first side 103 of the substrate 102 along a first direction (e.g., along the vertical or Z direction in FIG. 1). The conductive antenna 106, 107 includes a first portion 106 with a top surface that is exposed along the second side 109 of the antenna assembly 104, and a second portion 107 with a bottom surface that is exposed along the first side 105 of the antenna assembly 104. The second portion 107 is spaced apart from and at least partially faces an aperture in a conductive layer of the substrate 102 along an air gap in the first direction between the substrate 102 and the antenna assembly 104. In the illustrated example, the air gap extends laterally outward of the attached semiconductor die 101 in order to provide a direct air gap with low dielectric constant between the conductive antenna 106, 107 and an aperture in a conductive layer of the substrate 102.

The electronic device 100 also includes a support structure 110 is shown in FIG. 1 that supports the antenna assembly 104 and a spaced relationship to the substrate 102. In the illustrated example, the support structure 110 provides a controlled non-zero gap distance 111 along the first direction between the first side 105 of the antenna assembly 104 and the first side 103 of the substrate 102. The support structure 110 is mounted to a portion of the first side 103 of the substrate 102 and to a portion of the first side 105 of the antenna assembly 104. In the illustrated example, the support structure 110 includes solder, such as one or more BGA type solder balls. In another possible implementation, the support structure 110 includes epoxy mounted to a portion of the first side 103 of the substrate 102 and to a portion of the first side 105 of the antenna assembly 104 in order to support the first side 105 of the antenna assembly 104 spaced apart from the first side 103 of the substrate 102 along the first direction Z by a non-zero spacing distance 111.

The substrate 102 in one example includes conductive pads that provide mechanical and electrical interconnection of the semiconductor die 101 with the substrate 102 by solder connections established using BGA solder balls 110. In one implementation, the substrate 102 includes solder mask material 113 between various conductive pads on the top side 103 of the substrate 102. An insulative underfill material 114 is formed between the solder balls 110 under the semiconductor die 101. The semiconductor die 101 includes conductive terminals on a bottom side thereof, including a first terminal 115 and a pair of second terminals 117 in the illustrated example. The conductive terminals on the bottom side of the semiconductor die 101 are soldered to respective conductive pads on the first side 103 of the substrate 102.

The substrate 102 includes a conductive layer 116 with an opening or aperture 118. In the illustrated example, the conductive layer 116 is formed on or along the first side 103 of the substrate 102. In other possible implementations, the conductive layer 116 and the aperture 118 are formed in an inner layer of the substrate 102. As further shown in the sectional top view of FIG. 2, the illustrated example includes two apertures 118 having I-shapes with a width 119 as shown in FIGS. 1 and 2. A single aperture or multiple apertures having different shapes (not shown) can be used in other implementations. As further shown in FIGS. 1 and 3, the example antenna assembly 104 includes two conductive second portions (e.g., which can be patch portions) 107 aligned with the respective apertures 118, and a single base portion 106. In another implementation, a single base portion 106 is used which has a different shape than the inverter U-shape illustrated in FIG. 3. In a further implementation, the electronic device 100 includes more than one base portion 106, for example, with a respective base portion of any suitable shape associated with a corresponding one of the apertures 118.

The substrate 102 in this example includes an inner layer with a conductive feed line 120, where the conductive layer 116 and the apertures 118 are positioned along the Z direction between the conductive feed line 120 and the antenna assembly 104. As shown in phantom line in the sectional view of FIG. 2, the conductive feed line 120 provides a radiating source in one example for transmission through the apertures 118. The radiated energy passes through the apertures 118 and through the air gap between the apertures 118 and the second or patch portions 107 of the conductive antenna to provide a low dielectric constant transmission medium for enhanced antenna efficiency and performance.

The substrate 102 further includes a second side 121 (e.g., the bottom or lower side in the illustrated orientation of FIG. 1) with conductive features (e.g., pads). The second side 121 is spaced apart from the first side 103 along the first (Z) direction. The packaged electronic device 100 further includes conductive terminals, such as BGA type solder balls 122, copper posts, etc., that are attached to the second side 121 of the substrate 102 to facilitate soldering to a host printed circuit board (not shown). In this example, moreover, the substrate 102 provides patterned conductive features that electrically couple the second terminal 117 of the semiconductor die 101 to the conductive layer 116, for example, to provide a circuit ground connection for the antenna apparatus, and patterned conductive features and vias on the first and second layers to interconnect the first terminal 115 of the semiconductor die 101 to the conductive feed line 120.

As shown in FIG. 1, the semiconductor die 101 is laterally spaced apart from the aperture 118 along a second direction (e.g., the X direction in the illustrated orientation), where the second direction (X) is orthogonal to the first direction (Z). As shown in FIGS. 1 and 2, the conductive layer 116 and its apertures 118 are spaced apart from the conductive feed line 120 along the first direction Z, and the aperture 118 is aligned with a portion of the conductive feed line 120. Any combination of the conductive layer 116 and the conductive feed line 120 can be used in which the aperture or apertures 118 are positioned along the first direction (Z) between the conductive feed line 120 and the conductive antenna portions 106, 107 of the antenna assembly 104. In the illustrated example, the conductive feed line 120 is positioned in an inner layer of the multilayer substrate 102, and the conductive layer 116 and the aperture 118 are positioned on the top conductive layer of the substrate 102. In another possible example, the conductive layer 116 and the conductive feed line 120 are positioned in respective inner layers of a multilayer substrate 102, with the conductive layer 116 positioned along the first direction (Z) between the conductive feed line 120 and the antenna assembly 104. In yet another example, the conductive feed line 120 is positioned along the bottom side 121 of the substrate, and the conductive layer 116 is located in an inner layer or along the top side 103 of the substrate, with the conductive layer 116 and the aperture or apertures 118 located along the first direction (Z) between the conductive feed line 120 and the conductive antenna portions 106, 107 of the antenna assembly 104.

The integration of the antenna assembly 104 in the packaged electronic device 100 provides an integrated antenna apparatus including the antenna assembly 104, the conductive feed line 120, the conductive layer 116 with the aperture or apertures 118, and the support structure 110. In this implementation, the antenna assembly 104 includes the conductive antenna with the first and second portions 106 and 107 that have exposed surfaces along the respective second and first sides 109 and 105. The conductive feed line 120 and the conductive layer 116 extend on or in the substrate 102, and the conductive layer 116 includes one or more apertures 118 between the conductive feed line 120 and the second portion 107 of the conductive antenna. The support structure 110 is mounted to a portion of the substrate 102 and to a portion of the first side 105 of the antenna assembly 104 to support the antenna assembly 104 and to provide an air gap between the second portion 107 of the conductive antenna 106, 107 and the aperture or apertures 118.

Figure 4:
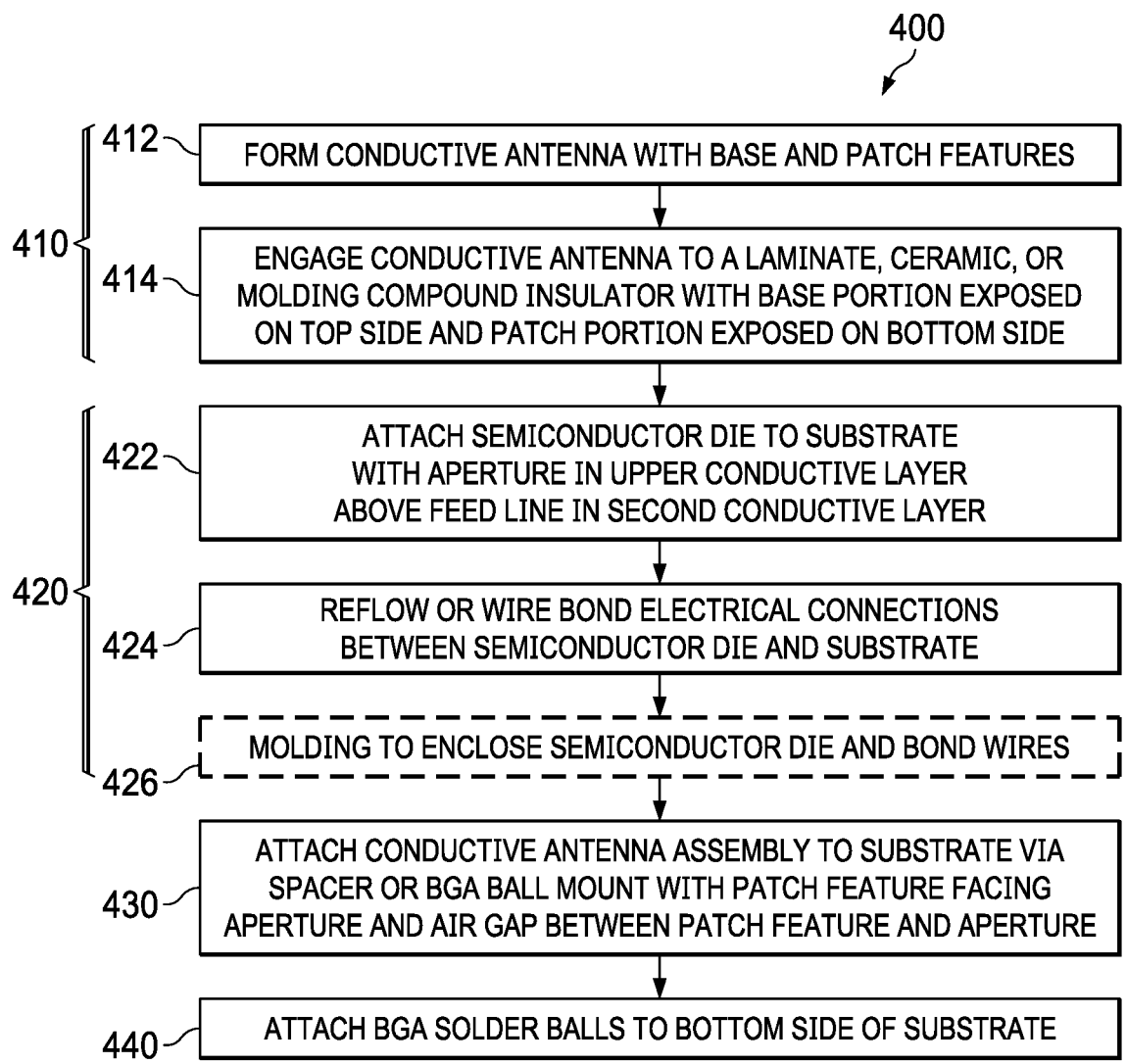
FIG. 4 is a flow diagram of a method according to another aspect.

FIG. 4 shows a packaged electronic (e.g., semiconductor device) manufacturing or fabrication method 400 and FIGS. 5-12 illustrate the packaged electronic device 100 undergoing fabrication processing according to the method 400. This example demonstrates assembly of a flip chip, chip scale package (FC/CSP) electronic device 100. In other implementations, the integrated antenna apparatus of the present disclosure is used in other electronic devices having any suitable package type, including without limitation ball grid array (BGA), formed and unformed ceramic flat pack (CFP), land grid array (LGA), plastic flame mount package (PFM), quad flat package (QFP), quad flat no lead package (QFN) single and dual in the-line packages (SIP, DIP), column grid array (CGA), Chip on flex (COS), chip on glass (COG), die size ball grid array (DSBGA), wafer chip scale package (WCSP), pleaded chip carrier (LCC), substrate metal cavity with lid (NFMCA-LID), pin grid array (PGA), package on substrate (POS), small outline and small outline no lead (Esso, SON), transistor outline (TO), zig-Zed in line (ZIP), micro chip scale package (uCSP), ceramic ball grid array (CBGA), glass-sealed or other ceramic dual in-line package (CDIP), side-braze ceramic dual in-line package (CDIP SB), ceramic pin grid array (CPGA), ceramic zig-sad package (CZIP), dual flat package (DFP), thermally enhanced or high temperature Low Profile, quad flat package, small outline package, thin shrink small-outline package or very thin quad flat package (HLQFP, HQFP, HSOP, HTQFP, HTSSOP, HVQFP), J-leaded ceramic or metal chip carrier (JLCC), leadless ceramic chip carrier (LCCC), low profile quad flat pack (LQFP), plastic dual in-line package (PDIP), J-lead a small outline package (SOJ), small outline package (SOP), shrink small outline package (SSOP), thin quad flat package (TQFP), thin shrink small-outline package (TSSOP), thin very fine land grid array (TVFLGA), very thin small-outline package (TVSOP), very thin quad flat package (VQFP), dual in-line memory module (DIMM), thermally enhanced shrink small-outline package (HSSOP), leadless plastic Chip carrier (LPCC), multi-chip module (MCM), metal quad flat package (MQFP), plastic pleaded chip carrier (PLCC), plastic pin grid array (PPGA), shrink dual in-line package (SDIP), single in-line memory module (SIMM) small outline dual in-line memory module (SODIMM), thin small outline package, (TSOP), and very small outline package (VSOP).

The method 400 begins at 410 in FIG. 4 with construction of the antenna assembly 104. In this example, the antenna assembly 104 is constructed as a pre-molded lead frame, including forming a conductive antenna at 412 (antenna 106, 107) with a first (e.g., base) portion 106, and a second (e.g., patch) portion 107. Any suitable lead frame fabrication techniques can be used at 412, for example, cutting, stamping, and/or etching a copper plate to form the portions 106 and 107. FIG. 5 shows one example, in which a copper plate or strip undergoes chemical etching process 500 that forms the first and second portions 106 and 107 as described above in connection with FIG. 1.

The method continues at 414 with engaging the conductive antenna 106, 107 to the insulator 108 to form the antenna assembly 104 with the opposite first and second sides 105 and 109, where the top surface of the first portion 106 is exposed along the second side 109, and the bottom surface of the second portion 107 is exposed along the first side 105. FIG. 6 shows one example, in which a molding process 600 is performed that engages molding compound insulator material 108 with various sides and surfaces of the conductive antenna 106, 107 to create the pre-molded antenna assembly 104 as previously described. The molding process 600 in one implementation engages a molding compound 108, 1308 with portions of the conductive antenna 106, 107, and leaves the surface of the first portion 106 exposed along the second side 109, and the surface of the second portion 107 exposed along the first side 105.

Figure 7:
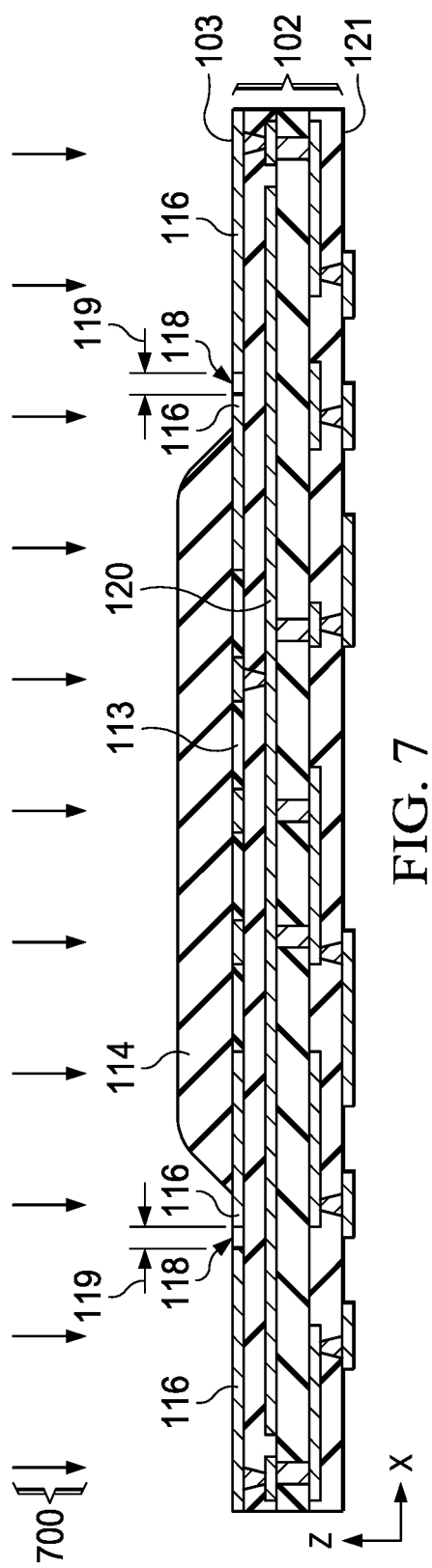

At 420 in FIG. 4, the method 400 includes die attach and electrical interconnection processing. Many different techniques, processes, and equipment can be used in different implementations. The illustrated example involves flip-chip die attach and reflow soldering at 420. In this implementation, the semiconductor die 101 is attached to the substrate 102 at 422 with the aperture 118 in the upper conductive layer 116 above the conductive feed line 120 and the second conductor layer, as shown in the example substrate 102 discussed above in connection with FIGS. 1 and 2. FIG. 7 shows one example in which the substrate 102 undergoes a deposition process 700 that forms the insulative underfill material 114 laterally spaced apart from and between the apertures 118 of the conductive layer 116.

Figure 8:
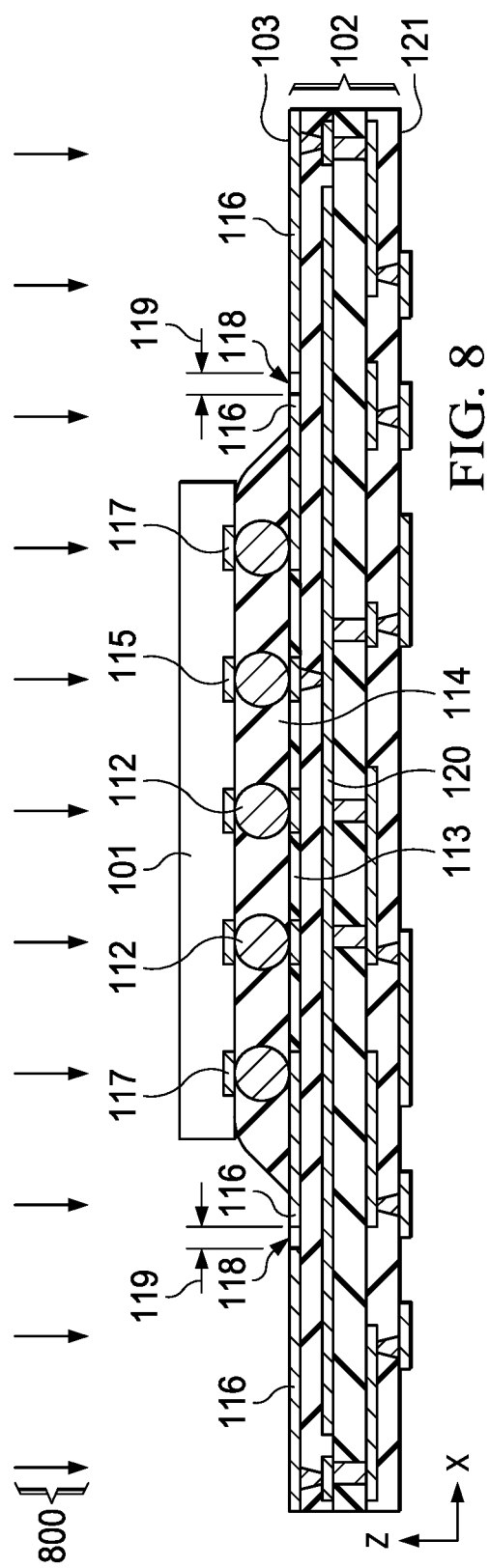
Figure 9:
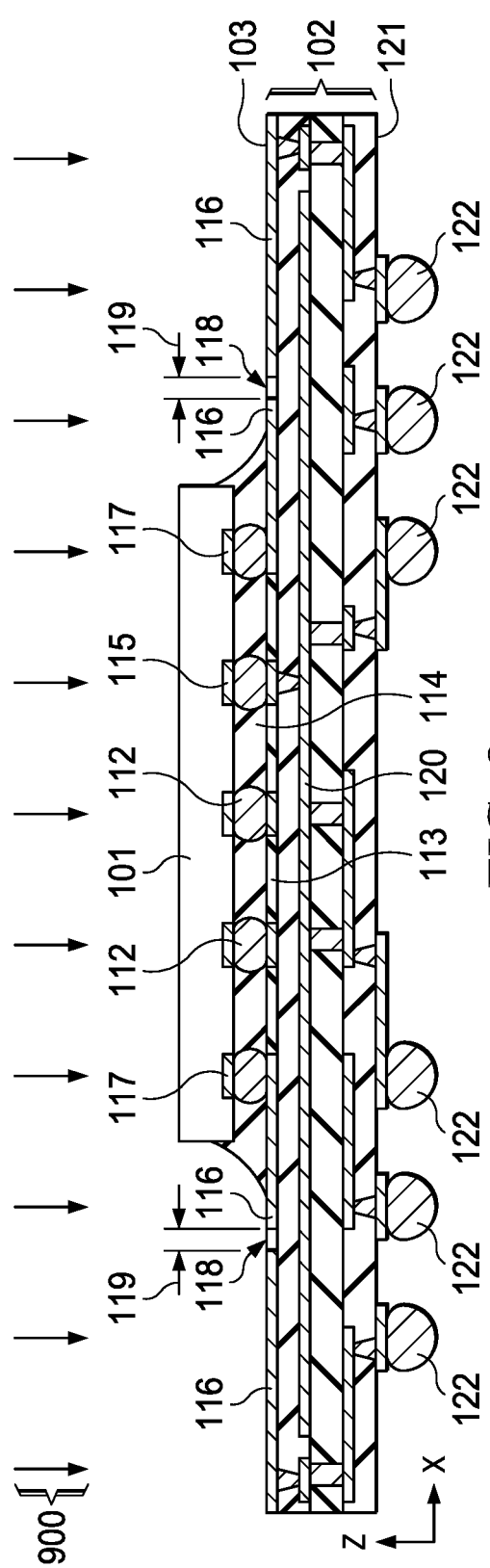

The die attachment at 422 continues with a pick and place process 800 in FIG. 8 that positions the semiconductor die 101 and associated BGA solder balls 112 onto the first side 103 of the substrate 102, with the solder balls 112 positioned above associated conductive pads on the first side 103 of the substrate 102. The flip-chip attach process 800 engages conductive features of the semiconductor die 101 to the conductive pads of the substrate 102. At 424 in FIG. 4, the method continues with reflowing the solder balls 112 to form electrical connections between the semiconductor die 101 and the substrate 102. FIG. 9 shows one example, in which the partially assembled electronic device undergoes a thermal reflow process 900 that forms the electrical interconnections between the semiconductor die 101 and the substrate 102. The processing at 424 electrically couples the terminals 115 and 117 of the semiconductor die 101 to conductive pads of the substrate 102. The reflow process 900 solders the conductive features of the semiconductor die 101 to the conductive pads of the substrate 102.

In another example (e.g., FIGS. 13 and 14 below), a semiconductor die is glued or otherwise adhered to the first side 103 of the substrate 102 at 422, a wire bonding process is performed at 424 to form bond wire electrical connections between the semiconductor die and the substrate, and a molding process is performed at 426 in FIG. 4 that creates a molded structure to enclose the bond wires, the semiconductor die 101, and a portion of the first side 103 of the substrate spaced apart from and between the apertures 118.

Figure 10:
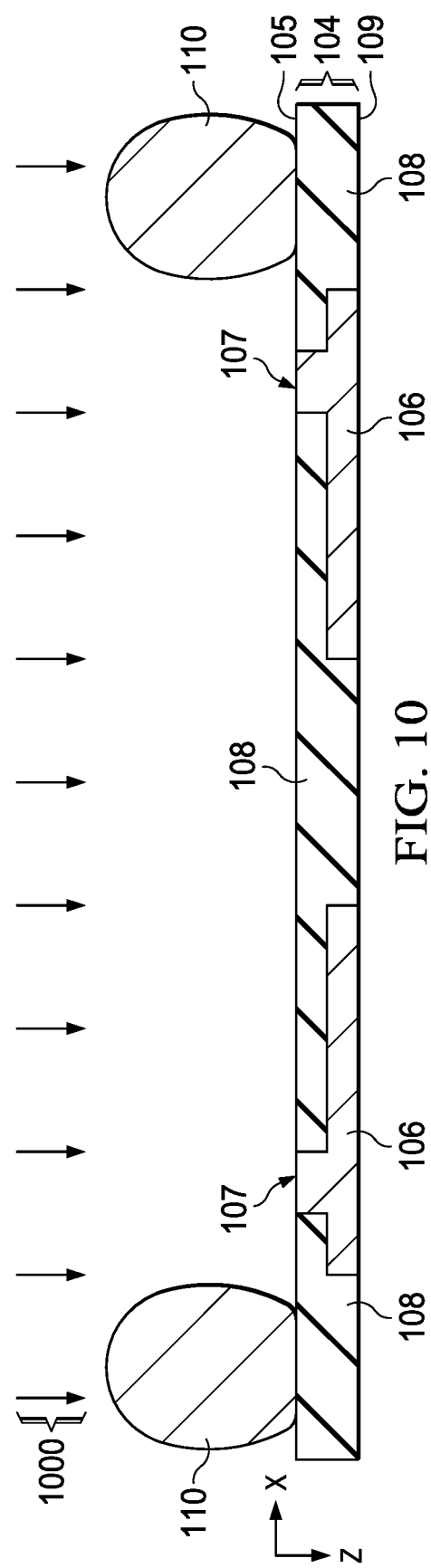
Figure 11:
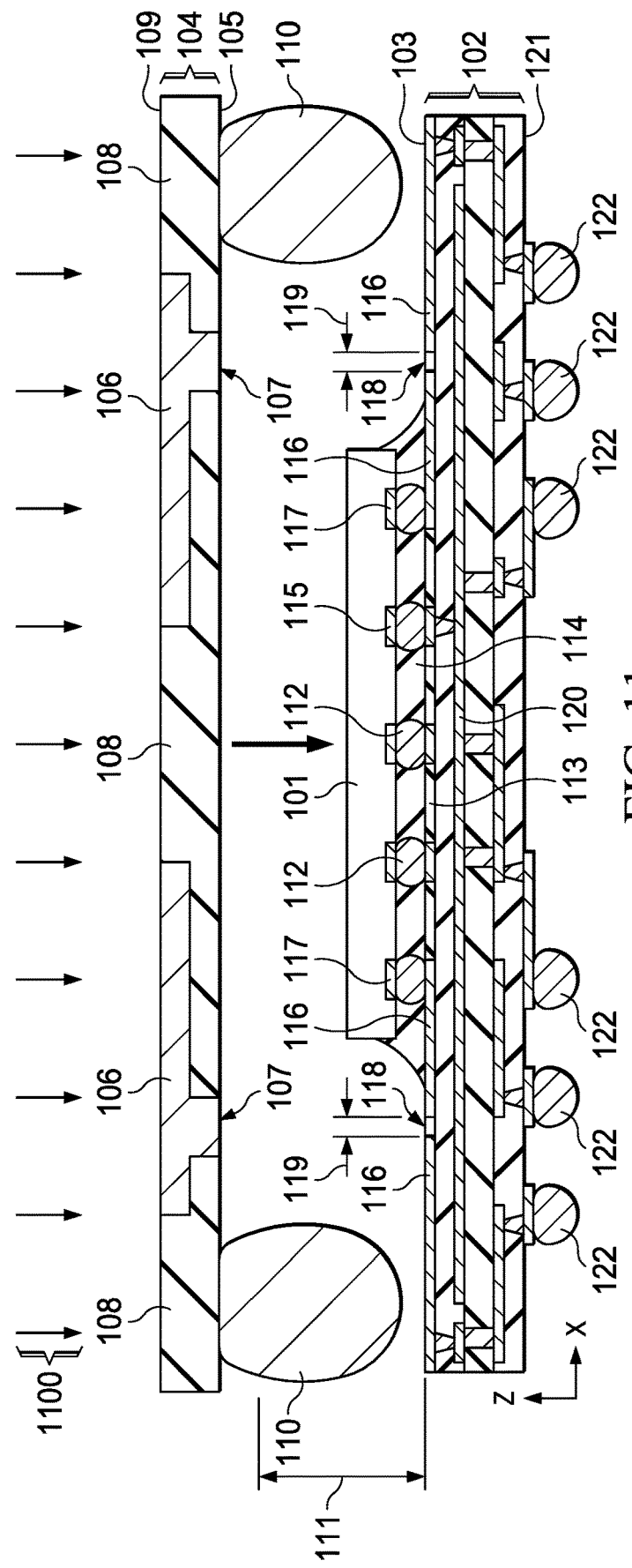
Figure 12:
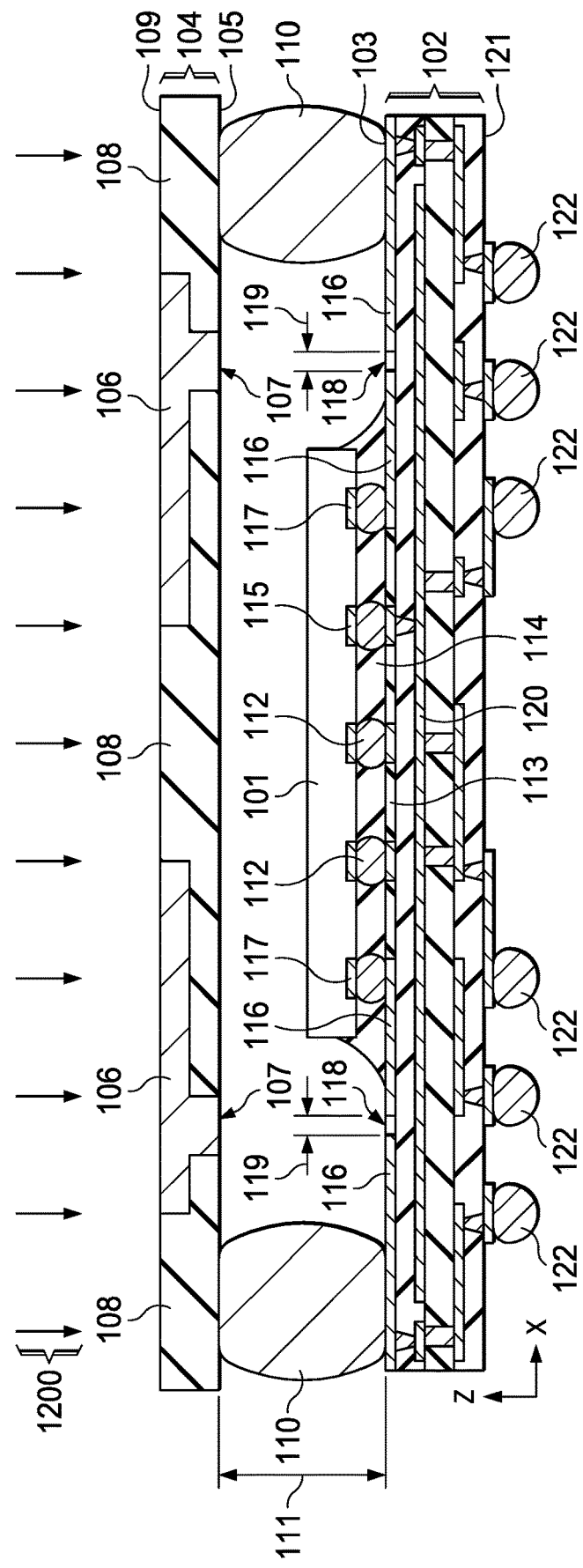

The method 400 continues at 430 in FIG. 4 with attaching the antenna assembly 104 to the substrate 102 using the support structure 110 to provide an air gap between the exposed portion 107 of the conductive antenna 106, 107 of the antenna assembly 104 and the aperture 118 in the conductive layer 116 on or in the substrate 102. FIG. 10 shows one example in which the antenna assembly 104 undergoes a ball grid array (BGA) ball attach process 1000 that attaches one or more solder ball support structures 110 to the first side 105 of the antenna assembly 104. FIG. 11 shows performance of a pick and place process 1100 that locates the antenna assembly 104 and the solder balls 110 downward onto the substrate 102. The process 1100 in this example includes positioning the antenna assembly 104 with the surface of the second portion 107 spaced apart from and facing the aperture 118 in the conductive layer 116 on or in the substrate 102 and reflowing the solder ball support structures 110. It is noted that the assembly using the support structures 110 may, but need not, provide an electrical connection between the substrate 102 and the antenna assembly 104. In another possible implementation, the antenna assembly 104 is attached to the substrate 102 using a different type or form of support structure, such as epoxy that is laterally spaced apart from the aperture or apertures 118, and that positions the antenna assembly 104 with the surface of the second portion 107 spaced apart from and facing the aperture 118 in the conductive layer 116 on or in the substrate 102. At 440, in one example, the method 400 also includes attaching conductive solder balls 122 to the conductive features on the second side 121 of the substrate 102 to provide the finished packaged electronic device 100 illustrated in FIGS. 1-3 above.

Figure 13:
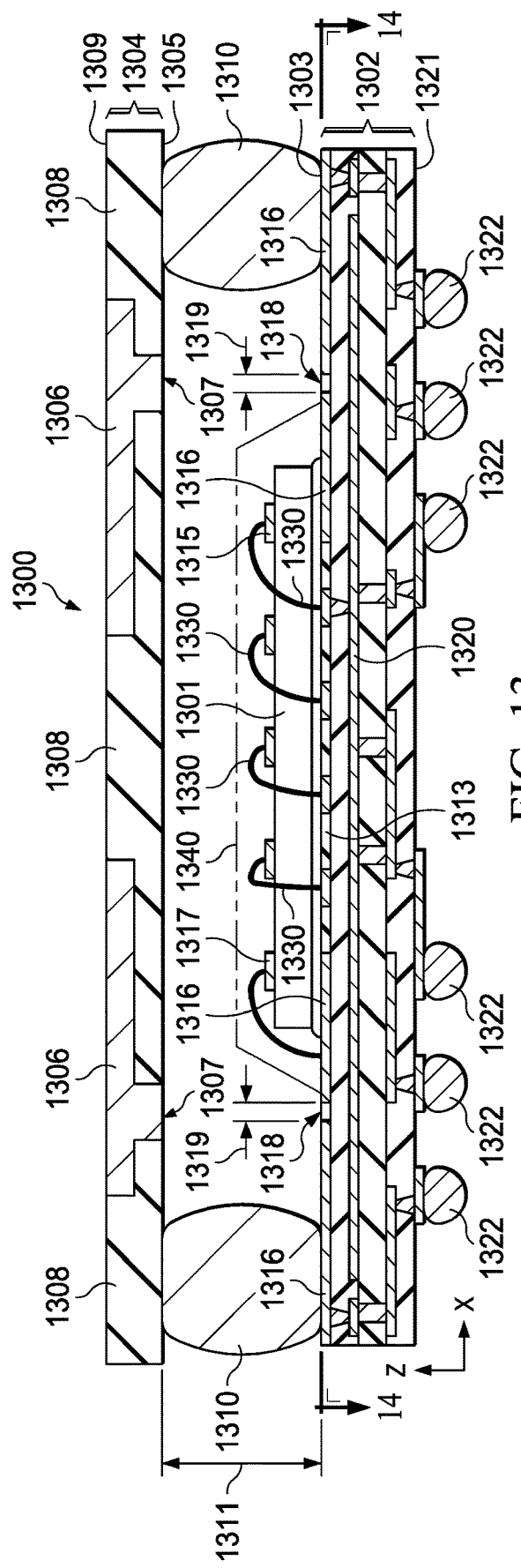
FIG. 13 is a sectional side elevation view of another electronic device with an integral antenna.
Figure 14:
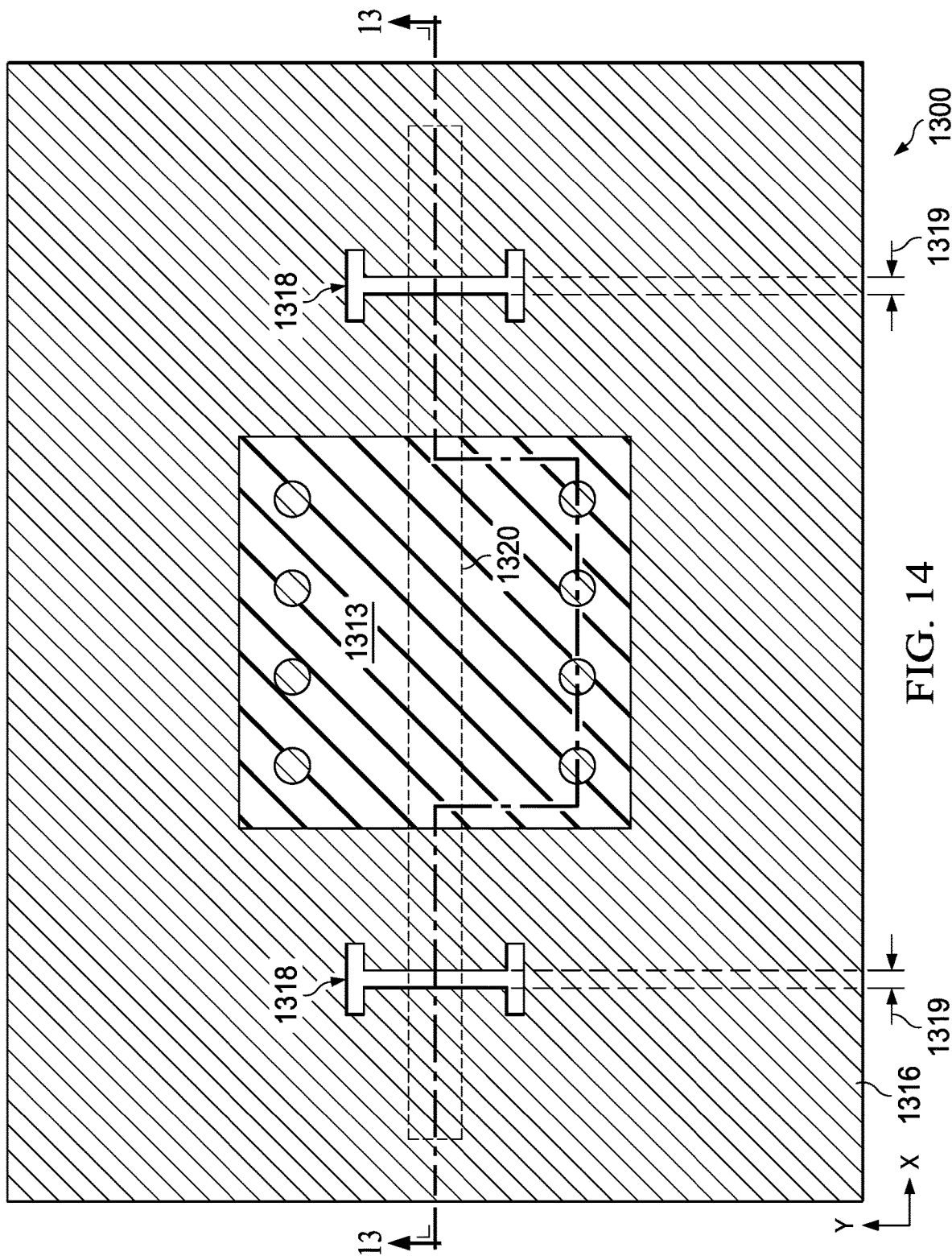
FIG. 14 is a sectional top plan view of the electronic device taken along line 14-14 in FIG. 13.

FIGS. 13 and 14 show another example electronic device 1300 with an integrated antenna apparatus according to a further aspect of the present disclosure. FIG. 14 shows a sectional top plan view of the electronic device 1300 taken along line 14-14 in FIG. 13, and the sectional view of FIG. 13 is taken along line 13-13 in FIG. 14. This example includes a semiconductor die 1301 mounted on a substrate 1302 using epoxy, an electrical connection therebetween using bond wires 1330. The substrate 1302 is a planar multilayer with patterned conductive features formed on or within laminated organic layers, with conductive vias interconnecting certain features of different layers. In other implementations a single layer substrate is used, including conductive features on top and bottom sides thereof and vias interconnecting the top and bottom sides. The electronic device 1300 includes a semiconductor die 1301 and a substrate 1302 having a first side 1303. The semiconductor die 1301 is attached to the first side 1303 of the substrate 1302 by epoxy or other attachment means.

The electronic device 1300 and FIGS. 13 and 14 includes an antenna assembly 1304, such as a molded lead frame structure in one example. The antenna assembly 1304 includes a first side 1305, for example, a lower or bottom side in the illustrated orientation. The first side 1305 of the antenna assembly 1304 is generally parallel to and faces the first side 1303 of the substrate 1302. The antenna assembly 1304 includes a conductive antenna 1306, 1307 and an insulator 1308. In one example, the conductive antenna 1306, 1307 is or includes aluminum. In another example, the conductive antenna 1306, 1307 is or includes copper. In one example, the insulator 1308 includes a ceramic material. In another example, the insulator 1308 includes a laminate. In the illustrated example, the insulator 1308 includes a molding compound. The antenna assembly 1304 includes a planar second (e.g., upper) side. The first side 1305 of the antenna assembly 1304 is spaced apart from and faces the first side 1303 of the substrate 1302 along the Z direction in FIG. 13). The conductive antenna 1306, 1307 includes a first portion 1306 with a top surface that is exposed along the second side 1309 of the antenna assembly 1304, and a second portion 1307 with a bottom surface that is exposed along the first side 1305 of the antenna assembly 1304. The second portion 1307 is spaced apart from and at least partially faces an aperture in a conductive layer of the substrate 1302 along an air gap in the first direction between the substrate 1302 and the antenna assembly 1304. In the illustrated example, the air gap extends laterally outward of the attached semiconductor die 1301 in order to provide a direct air gap with low dielectric constant between the conductive antenna 1306, 1307 and an aperture in a conductive layer of the substrate 1302.

The electronic device 1300 also includes a support structure 1310 is shown in FIG. 13 that supports the antenna assembly 1304 and a spaced relationship to the substrate 1302. In the illustrated example, the support structure 1310 provides a controlled non-zero gap distance 1311 along the first direction between the first side 1305 of the antenna assembly 1304 and the first side 1303 of the substrate 1302. The support structure 1310 is mounted to a portion of the first side 1303 of the substrate 1302 and to a portion of the first side 1305 of the antenna assembly 1304. In the illustrated example, the support structure 1310 includes solder, such as one or more BGA type solder balls. In another possible implementation, the support structure 1310 includes epoxy mounted to a portion of the first side 1303 of the substrate 1302 and to a portion of the first side 1305 of the antenna assembly 1304 in order to support the first side 1305 of the antenna assembly 1304 spaced apart from the first side 1303 of the substrate 1302 along the first direction Z by a non-zero spacing distance 1311.

The substrate 1302 in one example includes conductive pads on the top side thereof that provide electrical interconnection of the semiconductor die 1301 with the substrate 1302 by the bond wires 1330. In one implementation, the substrate 1302 includes solder mask material 1313 between various conductive pads on the top side 1303 of the substrate 1302. The semiconductor die 1301 includes a first terminal 1315 and a second terminal 1317 in the illustrated example. The substrate 1302 includes a conductive layer 1316 with an opening or aperture 1318. In the illustrated example, the conductive layer 1316 is formed on or along the first side 1303 of the substrate 1302. In other possible implementations, the conductive layer 1316 and the aperture 1318 are formed in an inner layer of the substrate 1302. As further shown in the sectional top view of FIG. 14, the illustrated example includes two apertures 1318 having I-shapes with a width 1319 as shown in FIGS. 13 and 14. A single aperture or multiple apertures having different shapes (not shown) can be used in other implementations. The top plan view of the electronic device 1300 in FIGS. 13 and 14 in one example is the same as is shown in FIG. 3 above.

The substrate 1302 in this example includes an inner layer with a conductive feed line 1320, where the conductive layer 1316 and the apertures 1318 are positioned along the Z direction between the conductive feed line 1320 and the antenna assembly 1304. As shown in phantom line in the sectional view of FIG. 14, the conductive feed line 1320 provides a radiating source in one example for transmission through the apertures 1318. The radiated energy passes through the apertures 1318 and through the air gap between the apertures 1318 and the second or patch portions 1307 of the conductive antenna to provide a low dielectric constant transmission medium for enhanced antenna efficiency and performance. The substrate 1302 further includes a second side 1321 with conductive features (e.g., pads). The second side 1321 is spaced apart from the first side 1303 along the first (Z) direction. The packaged electronic device 1300 further includes conductive terminals 1322, such as BGA type solder balls, copper posts, etc., that are attached to the second side 1321 of the substrate 1302 to facilitate soldering to a host printed circuit board (not shown). In this example, moreover, the substrate 1302 provides patterned conductive features that electrically couple the second terminal 1317 of the semiconductor die 1301 to the conductive layer 1316, for example, to provide a circuit ground connection for the antenna apparatus, and patterned conductive features and vias on the first and second layers to interconnect the first terminal 1315 of the semiconductor die 1301 to the conductive feed line 1320.

As shown in FIG. 13, the semiconductor die 1301 is laterally spaced apart from the aperture 1318 along a second direction (e.g., the X direction in the illustrated orientation), where the second direction (X) is orthogonal to the first direction (Z). As shown in FIGS. 13 and 14, the conductive layer 1316 and its apertures 1318 are spaced apart from the conductive feed line 1320 along the first direction Z, and the aperture 1318 is aligned with a portion of the conductive feed line 1320. As with the example of FIGS. 1-3 above, any combination of the conductive layer 1316 and the conductive feed line 1320 can be used in which the aperture or apertures 1318 are positioned along the first direction (Z) between the conductive feed line 1320 and the conductive antenna portions 1306, 1307 of the antenna assembly 1304. In the illustrated example, the conductive feed line 1320 is positioned in an inner layer of the multilayer substrate 1302, and the conductive layer 1316 and the aperture 1318 are positioned on the top conductive layer of the substrate 1302. In another possible example, the conductive layer 1316 and the conductive feed line 1320 are positioned in respective inner layers of a multilayer substrate 1302, with the conductive layer 1316 positioned along the first direction (Z) between the conductive feed line 1320 and the antenna assembly 1304. In yet another example, the conductive feed line 1320 is positioned along the bottom side 1321 of the substrate, and the conductive layer 1316 is located in an inner layer or along the top side 1303 of the substrate, with the conductive layer 1316 and the aperture or apertures 1318 located along the first direction (Z) between the conductive feed line 1320 and the conductive antenna portions 1306, 1307 of the antenna assembly 1304.

The described example packaged electronic devices, antenna apparatus, and fabrication methods facilitate integration of high performance antennas in packaged electronic devices, with improved antenna performance by providing a low dielectric constant airgap in the antenna structure between the signal feed line and aperture, and the antenna patch structure, without any adverse cost trade-off. Certain implementations can use simple pre-molded lead frame structures for the antenna structure 104, 1304 to enable high-performance antenna operation. The illustrated examples provide hybrid packaging structures in combination with a pre-molded lead frame or other antenna assembly 104, 1304, in combination with low-cost assembly processes to enable better antenna performance in combination with small factor associated with electronic devices having integrated antenna apparatus. In one possible implementation, the use of a pre-molded lead frame or other suitable antenna structure can be combined with many standard packaging types and processes (e.g., wire bonding, flip chip, wafer fan-out, etc.) to achieve low-cost high-performance solutions where wireless communications is desired in a packaged electronic device. The disclosed examples largely or wholly eliminate or avoid dielectric material between signal feed and antenna elements, which improves device performance with respect to lower insertion loss, higher bandwidth, and/or elimination of substrate modes. The disclosed examples, moreover, provide flexibility to develop a family of antenna lid frames for different applications, such as directivity (low gain & wide field-of-view (FOV) vs. high gain & narrow FOV), polarization (LP vs CP antennas), and beam direction (broadside vs. end-fire). Moreover, compared with other antenna integration approaches, the disclosed examples facilitate high performance and lower cost through lower substrate layer count and/or avoidance of expensive package solutions. In addition, the antenna assembly 104, 1304 can be switched and/or, the controlled support structure spacing 111, 1311 can be modified to provide a different antenna with different performance parameters for different products or product variants based on applications and frequency ranges without re-tooling the whole package.

Modifications are possible in the described examples, and other implementations are possible, within the scope of the claims.

What is claimed is:

1. An electronic device, comprising:
   a substrate having a first side, a second side, a conductive feed line, a conductive layer, and a conductive terminal, the second side being spaced apart from the first side along a first direction, the conductive feed line being spaced apart from the first side along the first direction, the conductive layer being spaced apart from the conductive feed line along the first direction, the conductive layer including an aperture aligned with a portion of the conductive feed line, and the conductive terminal being attached to the second side of the substrate;
   a semiconductor die attached to the first side of the substrate, the semiconductor die being spaced apart from the aperture along a second direction that is orthogonal to the first direction, and the semiconductor die comprising: a first terminal coupled to the conductive feed line, and a second terminal coupled to the conductive layer;
   an antenna assembly having a first side, a second side, a conductive antenna, and an insulator, the first side of the antenna assembly being spaced apart from and facing the first side of the substrate along the first direction, the conductive antenna including a first portion exposed along the second side of the antenna assembly, and a second portion exposed along the first side of the antenna assembly, the second portion being spaced apart from and at least partially facing the aperture along the first direction; and
   a support structure mounted to a portion of the first side of the substrate and to a portion of the first side of the antenna assembly, the support structure supporting the first side of the antenna assembly spaced apart from the first side of the substrate along the first direction.

2. The electronic device of claim 1, wherein the insulator includes a ceramic material.

3. The electronic device of claim 1, wherein the insulator includes a laminate.

4. The electronic device of claim 1, wherein the insulator includes a molding compound.

5. The electronic device of claim 4, wherein the support structure includes solder.

6. The electronic device of claim 4, wherein the support structure includes epoxy.

7. The electronic device of claim 1, wherein the support structure includes solder.

8. The electronic device of claim 1, wherein the support structure includes epoxy.

9. The electronic device of claim 1, wherein the conductive antenna includes copper.

10. The electronic device of claim 1, wherein the conductive layer extends along the first side of the substrate.

11. An antenna apparatus, comprising:
    an antenna assembly having a first side and an opposite second side, the antenna assembly comprising a conductive antenna, and an insulator engaging the conductive antenna, the conductive antenna including a first portion with an exposed surface along the second side, and a second portion exposed along the first side;
    a conductive feed line extending on or in a substrate;
    a conductive layer on or in the substrate, the conductive layer including an aperture between the conductive feed line and the second portion of the conductive antenna; and
    a support structure mounted to a portion of the substrate and to a portion of the first side of the antenna assembly to support the antenna assembly and to provide an air gap between the second portion of the conductive antenna and the aperture.

12. The antenna apparatus of claim 11, wherein the insulator includes a molding compound.

13. The antenna apparatus of claim 11, wherein the support structure includes solder.

14. The antenna apparatus of claim 11, wherein the conductive antenna includes copper.

15. The antenna apparatus of claim 11, wherein the conductive layer extends along a side of the substrate.

16. A method, comprising:
    attaching a semiconductor die to a substrate;
    electrically coupling terminals of the semiconductor die to conductive pads of the substrate; and
    attaching an antenna assembly to the substrate using a support structure to provide an air gap between an exposed portion of a conductive antenna of the antenna assembly and an aperture in a conductive layer on or in the substrate.

17. The method of claim 16, further comprising:
    forming a conductive antenna having a first portion, and a second portion; and
    engaging the conductive antenna to an insulator to form the antenna assembly having a first side and an opposite second side, with a surface of the first portion exposed along the second side, and a surface of the second portion exposed along the first side;

wherein attaching the antenna assembly to the substrate includes positioning the antenna assembly with the surface of the second portion spaced apart from and facing the aperture in the conductive layer on or in the substrate.

18. A method, comprising:

forming a conductive antenna having a first portion, and a second portion;

engaging the conductive antenna to an insulator to form an antenna assembly having a first side and an opposite second side, with a surface of the first portion exposed along the second side, and a surface of the second portion exposed along the first side including performing a molding process that engages a molding compound with portions of the conductive antenna, and that leaves the surface of the first portion exposed along the second side, and the surface of the second portion exposed along the first side;

attaching a semiconductor die to a substrate;

electrically coupling terminals of the semiconductor die to conductive pads of the substrate; and attaching an antenna assembly to the substrate using a support structure to provide an air gap between an exposed portion of a conductive antenna of the antenna assembly and an aperture in a conductive layer on or in the substrate including positioning the antenna assembly with the surface of the second portion spaced apart from and facing the aperture in the conductive layer on or in the substrate.

19. A method, comprising:

attaching a semiconductor die to a substrate including performing a flip-chip attach process that engages conductive features of the semiconductor die to the conductive pads of the substrate;

electrically coupling terminals of the semiconductor die to conductive pads of the substrate including performing a reflow process that solders the conductive features of the semiconductor die to the conductive pads of the substrate; and attaching an antenna assembly to the substrate using a support structure to provide an air gap between an exposed portion of a conductive antenna of the antenna assembly and an aperture in a conductive layer on or in the substrate.

20. A method, comprising:

attaching a semiconductor die to a substrate;

electrically coupling terminals of the semiconductor die to conductive pads of the substrate including performing a wire bonding process that couples bond wires between the conductive features of the semiconductor die and respective conductive pads of the substrate and attaching conductive solder balls to conductive features of the substrate; and attaching an antenna assembly to the substrate using a support structure to provide an air gap between an exposed portion of a conductive antenna of the antenna assembly and an aperture in a conductive layer on or in the substrate.

* * * * *